United States Patent [19]

Dayton et al.

[11] Patent Number: 4,663,598

[45] Date of Patent: May 5, 1987

[54] MONOLITHIC SWITCH

[75] Inventors: Birney D. Dayton, Nevada City; Richard Bannister, Grass Valley, both of Calif.

[73] Assignee: The Grass Valley Group, Grass Valley, Calif.

[21] Appl. No.: 863,805

[22] Filed: May 12, 1986

Related U.S. Application Data

[60] Continuation of Ser. No. 781,174, Sep. 30, 1985, abandoned, which is a division of Ser. No. 571,058, Jan. 16, 1984.

[51] Int. Cl.4 .............................................. H03F 3/04
[52] U.S. Cl. ................................ 330/288; 307/299 B; 330/310
[58] Field of Search .................... 307/299 B; 323/315, 323/316; 330/288, 310, 311, 307

[56]  References Cited

U.S. PATENT DOCUMENTS 4,371,792  2/1983  Dobkin .......................... 330/288 X Primary Examiner—Eugene R. LaRoche
Assistant Examiner—Steven J. Mottola
Attorney, Agent, or Firm—John Smith-Hill; Francis I. Gray

[57]  ABSTRACT

A current mirror which is stable and accurate for a broad range of beta gain factors of the individual transistors thereof has two transistors of one type connected substantially as a Darlington pair. A multiplying, multicollector transistor of the opposite type is connected serially between the collectors of the Darlington pair from base to emitter. One collector is diode connected to the base and the other is returned to a potential source. The collectors are of equal area.

9 Claims, 9 Drawing Figures

MONOLITHIC SWITCH

This is a continuation of application Ser. No. 781,174 filed Sept. 30, 1985 and now abandoned, which is a division of Ser. No. 571,058 filed Jan. 16, 1984.

BACKGROUND AND SUMMARY OF THE INVENTION

When information is transmitted over a communications system, it is often necessary to selectively route signals between various signal sources and receivers. In a general case, if signals are to be transmitted between "i" sources and "j" receivers, an i by j matrix is created which has a total of i.j crosspoints. A switch is needed at each crosspoint to open or close the circuit between a given source and a given receiver. In an extreme case within the television industry, a system having 65,536 crosspoints is used to route video encoded signals between 256 television cameras and 256 receivers.

Routing systems constructed according to the prior art have required dedicated control lines for each switch. Such prior art systems are disadvantageous in that the necessary interconnections become increasingly difficult to make as matrix size increases. Another disadvantage of prior art routing systems is that the amount of current needed to operate each switch remains relatively constant regardless of whether or not the switch conducts a signal to a receiver.

In accordance with the illustrated preferred embodiment of the present invention, a monolithic switch comprises two latches, a differential delay circuit, a switch, and several buffer amplifiers. A data signal received on a data line is loaded into the first latch when a simultaneous strobe signal is received on a strobe line. The crosspoint switch is armed to close and cause the signal to be routed to the selected output port. The data signal is passed from the first latch to the second latch, and a change of state of the crosspoint becomes possible, when a clock signal is received at the clock input of the second latch. Thus, the next desired state of each switch can be preset individually and asynchronously and the actual states of all the switches can be changed simultaneously, e.g., during a vertical interval if video signals are being routed. The total number of control lines needed to control all of the switches in the routing system is minimized since a common clock line is used, the switches in each row utilize a common data line, and the switches in each column utilize a common strobe line.

The data signal received by the second latch is coupled to the switch through the differential delay circuit which allows the switch to turn on more rapidly than it turns off. Thus, the routing system is of the make before break type, which eliminates voltage spikes in the output signal due to the output transistor turning off before another switch on the output bus turns on.

One output signal of the differential delay circuit commands the switch either to interrupt the incoming signal, or to conduct it to the buffer amplifier and from there, to a receiver. Another output signal of the differential delay circuit causes the current source of the buffer amplifier to enter a low current idle state if the incoming signal is to be interrupted. In this manner, a reduction in power consumption of approximately 8:1 is achieved when the input signal is interrupted.

Since a large signal routing system may include many thousands of these switches, the switches are manufactured in a monolithic structure to minimize size and power requirements. The problem in any monolithic structure is the inability to generate lateral PNP devices with a high beta. To overcome this problem the currents must be well defined to make the offsets work out correctly. A standard Darlington transistor pair configured as a current mirror may be used. However, this configuration alone does not adequately compensate for the low beta of lateral PNP transistors. Therefore the Darlington configurtion is modified by inserting a multi-collector transistor between the collectors of the Darlington transistors. One collector is diode connected to the base and the other is returned to a potential source. This provides accurate current representation at the output of the current mirror.

DESCRIPTION OF THE PREFERRED EMBODIMENT

Figure 1:
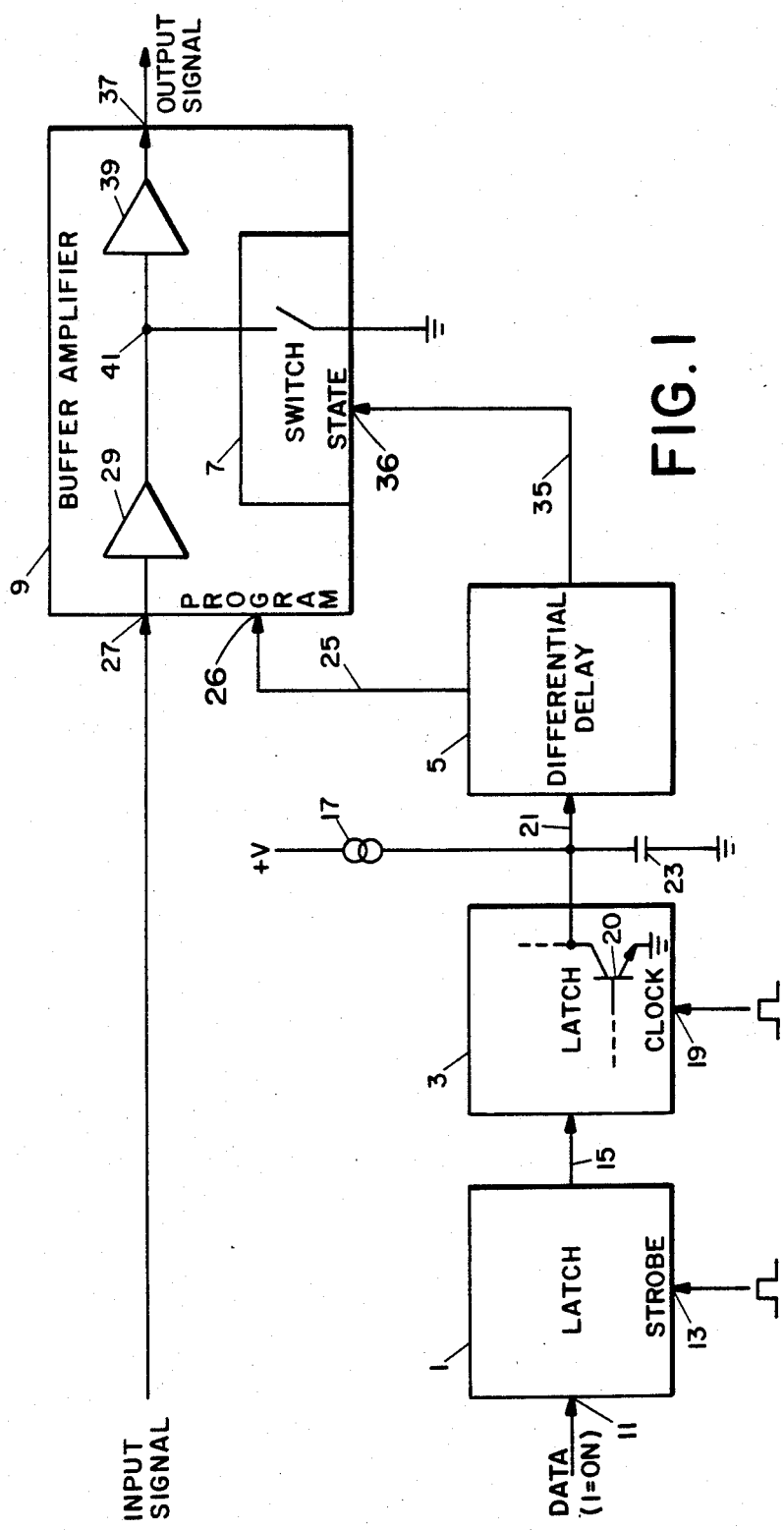
FIG. 1 is a block diagram of a switch which constructed according to the preferred embodiment of the present invention.

FIG. 1 is a block diagram of a switch which is constructed according to the preferred embodiment of the present invention and which is suitable for fabrication as a monolithic device. A latch 1 receives a data signal at data input terminal 11, stores said data upon receipt of a strobe signal at strobe (clock) input terminal 13, and presents the stored data to latch 3 via line 15. Latch 1 may comprise any of a number of well known D-type flip flop circuits with a digital "one" received at strobe input terminal 13 comprising the strobe signal. A digital "one" at data input terminal 11 comprises a command for the switch to turn on and, thereby, to conduct a selected signal from input port 27 to output port 37.

The data signal present on line 15 is received by a latch 3, which may comprise another D-type flip flop, and is applied to line 21 upon receipt of a clock signal at a clock input terminal 19. The data signal, as modified by capacitor 23 and current source 17, on line 21 is presented to a differential delay circuit 5. A delayed data signal and its inverse are presented by circuit 5 to lines 35 and 25, respectively. The operation of differential delay circuit 5, and the timing relationships of latches 1 and 3, will be discussed below with reference to FIGS. 4 and 5.

An incoming signal is received at input port 27 of a buffer amplifier 9 and, depending upon the state of a switch 7, is either conducted to output port 37 via amplifiers 29 and 39 or it is interrupted as discussed below. A delayed data signal on line 35 is received at the state input terminal 36 of switch 7 and causes switch 7 either to open or close depending upon the strobe, clock, and data signals received by latches 1 and 3. If switch 7 is closed, node 41 between amplifiers 29 and 39 is grounded thus interrupting the transmission of the signal between input and output ports 27 and 37. When switch 7 is closed, the signal on line 25 received at the program input terminal 26, causes the current sources internal to buffer amplifier 9 to enter an idle state and thus require considerably less power than is required during conductance of a signal between input and output ports 27 and 37. The timing relationship of switch 7 and buffer amplifier 9 will be discussed below with reference to FIG. 8.

The combination of the output transistor 20 of latch 3, current source 17 and capacitor 23 causes the buffer amplifier 9 and switch 7 to take longer to interrupt the transmission of the signal between input and output ports 27 and 37, than it does to initiate such a transmission. Since capacitor 23 is directly across transistor 20, the voltage on line 21 falls very quickly when transistor 20 is turned on to initiate the conduction of the signal through buffer amplifier 9. However, when transistor 20 turns off, the rate of charge of capacitor 23 is limited by the amount of current available from current source 17. Thus, the interruption of the transmission of the signal through buffer amplifier 9 cannot be initiated until capacitor 23 charges to the preset threshold voltage of differential delay 5. This then permits the adjustment of the ratio of the turn-on and turn-off times of the signal transmission. The reason for the difference in turn-on and turn-off times will become clear in the discussion with respect to FIGS. 2 and 3.

Figure 2:
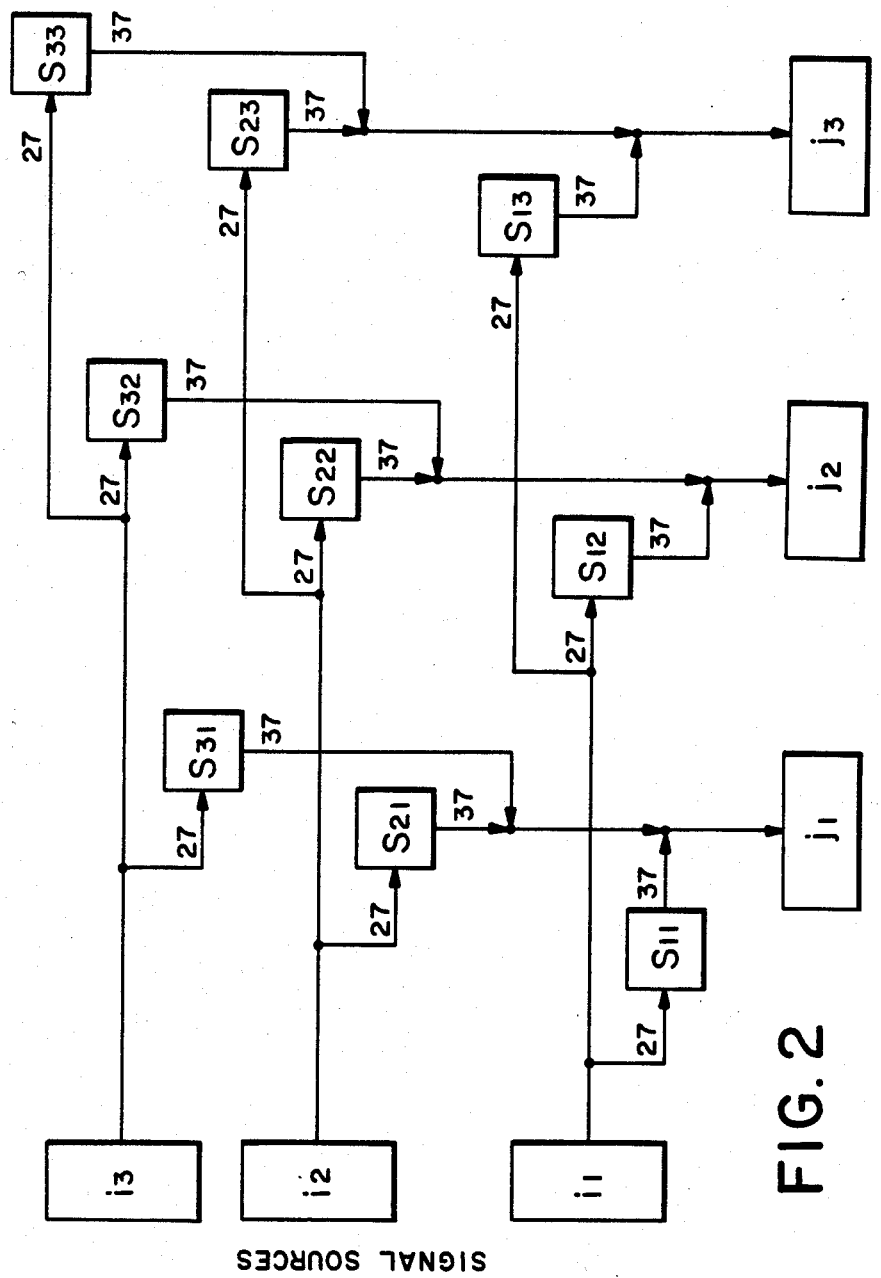
FIG. 2 is a block diagram of a 3 by 3 matrix routing system which uses nine of the switches depicted in FIG. 1.

FIG. 2 is a block diagram of a simple three by three signal routing system, which uses nine switches of the type depicted in FIG. 1. Note that turning on any given switch connects the output signal of a single signal source to a single signal receiver. For simplicity, each of the switches $S_{ij}$ are shown having only input and output ports 27 and 37, respectively. The data, strobe and clock lines have been omitted and are shown in FIG. 3 without the signal lines shown here.

Figure 3:
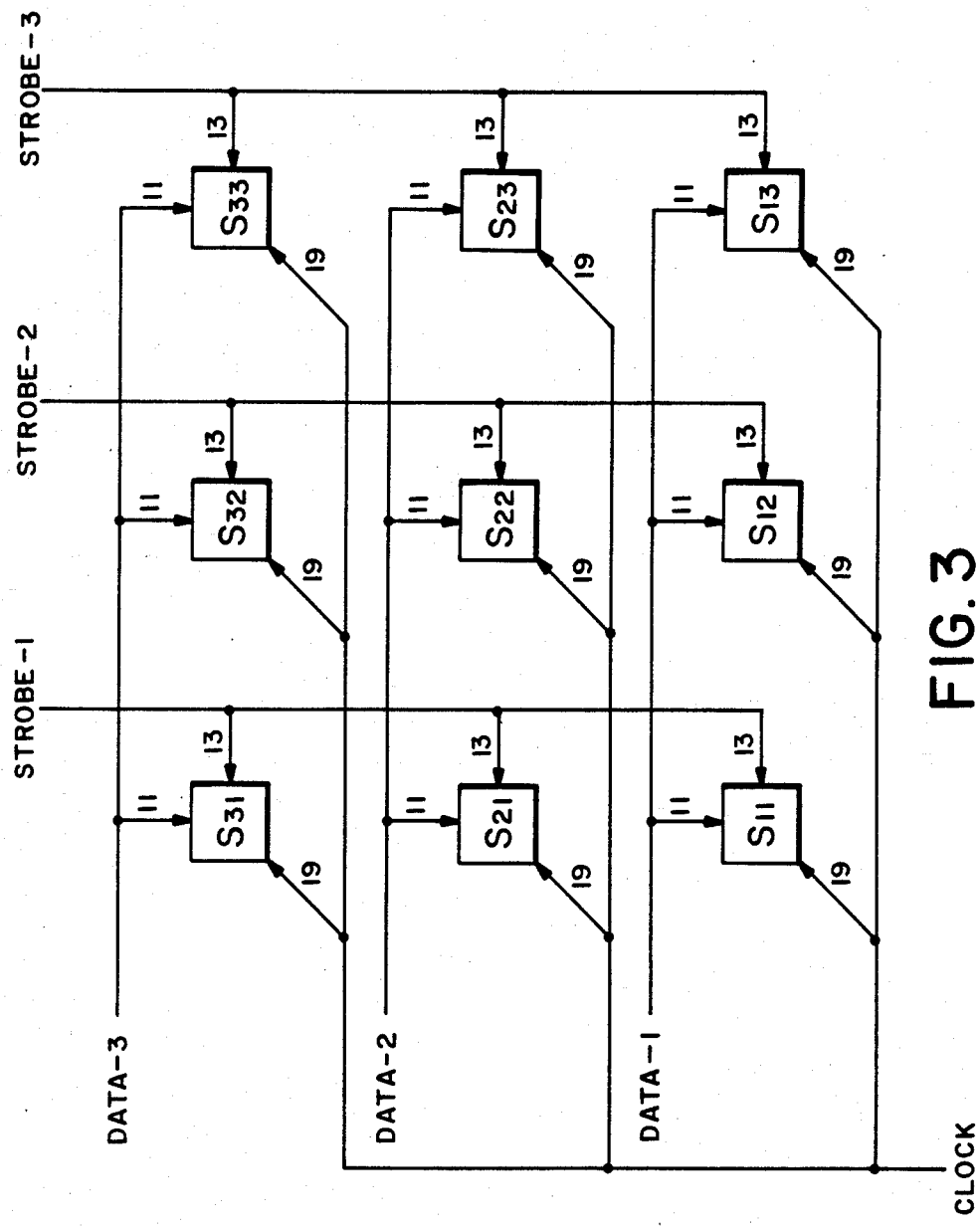
FIG. 3 shows the control line interconnections for the routing system depicted in FIG. 2.

FIG. 3 shows the control line connections used in the routing system depicted in FIG. 2. It should be noted that the system uses a common clock line which ensures that all of the switches change simultaneously. If the routing system is used to interconnect video sources and receivers, the clocking is typically done during a vertical flyback portion of a video signal so as not to disrupt the transmitted picture. Each row of switches uses a common data line (connected to data input terminals 11 shown in FIG. 1) and each column uses a common strobe line (strobe input terminals 13 in FIG. 1). By suitably timing the application of data and strobe pulses, the next state of each individual switch can be preset asynchronously with the final state change accomplished synchronously by the clock pulse. Thus, a three by three matrix uses seven control lines (three data lines, three strobe lines, and one clock line) and a ten by ten matrix uses only 21 control lines (ten data lines, ten strobe lines and one clock line).

Figure 4:
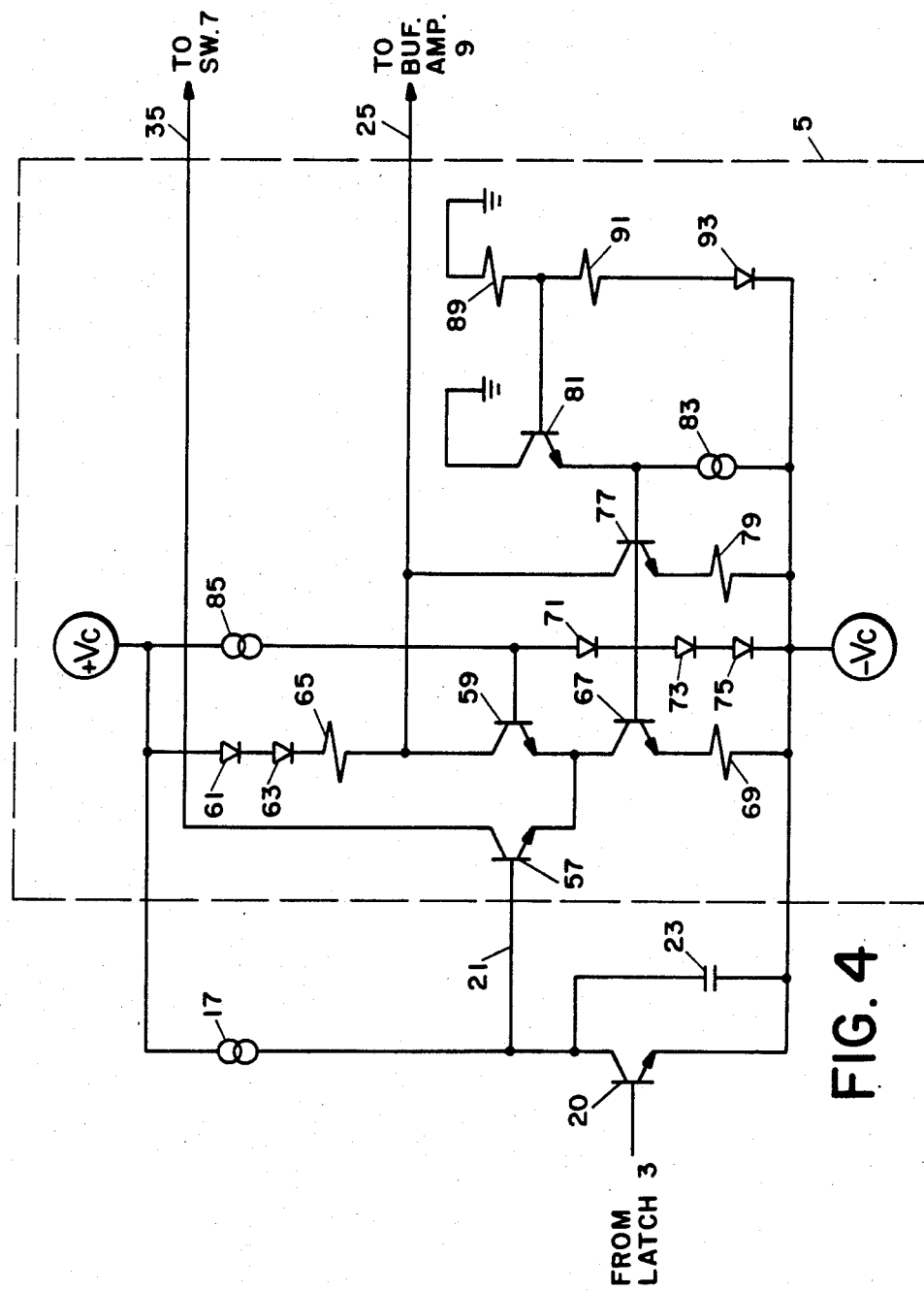
FIG. 4 is a schematic diagram of the differential delay circuit shown in FIG. 1.

FIG. 4 is a schematic diagram of differential delay circuit 5 and a portion of latch 3 as shown in FIG. 1. The data pulse, clocked by the clock pulse, is applied to the base of a transistor 20 in latch 3. Transistor 20 may comprise a high speed device having Schottky junctions. The emitter of transistor 20, and its collector through a capacitor 23, is connected to a $-Vc$ voltage supply. The collector is also connected to a $+Vc$ voltage supply through a current source 17 which may easily be constructed by persons of ordinary skill in the art. The collector of transistor 20 via line 21 is further connected to the base of a transistor 57. The collector of transistor 57 is in turn connected to line 35 to control switch 7. Transistor 57 is connected to transistor 59 as a differential pair with the collector of a transistor 67 connected to each of their emitters. The emitter of transistor 67 is connected through a resistor 69 to the $-Vc$ voltage supply.

The collector of transistor 59 is connected to the $+Vc$ voltage supply through two serially connected diodes 61 and 63 and a resistor 65. The base of transistor 59 is connected to the $-Vc$ voltage supply through three serially connected diodes 71, 73, and 75. The collector of transistor 59 is also connected to line 25 to program up or down the current sources of buffer amplifier 9 as necessary. The base of transistor 67 is connected to the base of a transistor 77. The collector of transistor 77 is connected to line 25 and the emitter of transistor 77 is connected, through a resistor 79, to the $-Vc$ voltage supply. The base of transistor 77 is connected to current source 83, the other end of which is connected to the $-Vc$ voltage supply. The base of transistor 77 is also connected to the emitter of a transistor 81. The collector of transistor 81 is connected to ground and the base of transistor 81 is connected to ground through a resistor 89. The base of transistor 81 is also connected to the $-Vc$ voltage supply through a resistor 91 and a diode 93.

The operation of differential delay circuit 5 shown in FIG. 4 may be better understood with additional reference to FIG. 1 and to the timing diagrams of FIGS. 5A-H. The base voltage of transistor 20 of latch 3, shown in FIG. 5E, goes from low to high when a clock pulse (FIG. 5D) occurs at clock input terminal 19 and the data signal present on line 15 (FIG. 5C) from latch 1 is high due to a simultaneous occurrence of a data signal (FIG. 5A) and a strobe pulse (FIG. 5B). The output signal of differential delay circuit 5 on line 25 (FIG. 5F) goes from high to low as the output of latch 3 (FIG. 5E) goes from low to high. But, the low to high transition of the output signal of differential delay circuit 5 on line 25 is delayed from the high to low transition of the output of latch 3. This means that, in a routing system of the type shown in FIG. 2, every signal receiver is always connected to at least one switch that is turned on if at least one video switch in each column is turned on. Thus, the generation of spurious voltage spikes in the output signal due to clamping the output signal to a negative D.C. voltage is avoided. Since lines 25 and 35 are connected to the collectors of transistors 59 and 57, respectively, and since those transistors are connected in a differential pair, the signal on line 35 is the inverse of the signal shown in FIG. 5F.

When a low to high transition occurs on the base of transistor 20, the base voltage of transistor 57 is allowed to fall quickly through transistor 20. On the other hand, when a high to low transition occurs on the base of transistor 20, the base voltage of transistor 57 ramps up relatively slowly due to the charging of capacitor 23 by current source 17. If the voltage on the base of transistor 20 is high, indicating that the switch has been turned on (conducting the signal applied to port 27 to port 37), transistor 20 turns on and transistor 57 turns off. This causes essentially zero current to flow on line 35 and through transistor 57.

If the voltage on the base of transistor 20 is low, indicating that the switch is to interrupt the signal before it reaches output port 37, transistor 20 turns off, transistor 57 turns on, and current flows on line 35 into the collector of transistor 57. Because of transistor 67, a constant total emitter current flows through the differential pair composed of transistor 57 and 59. The result is that, as the voltage on line 21 goes from low to high, and transistor 57 goes from off to on, the amount of collector current flowing on line 25 through transistor 59 goes from a high value to a low value.

Figure 6:
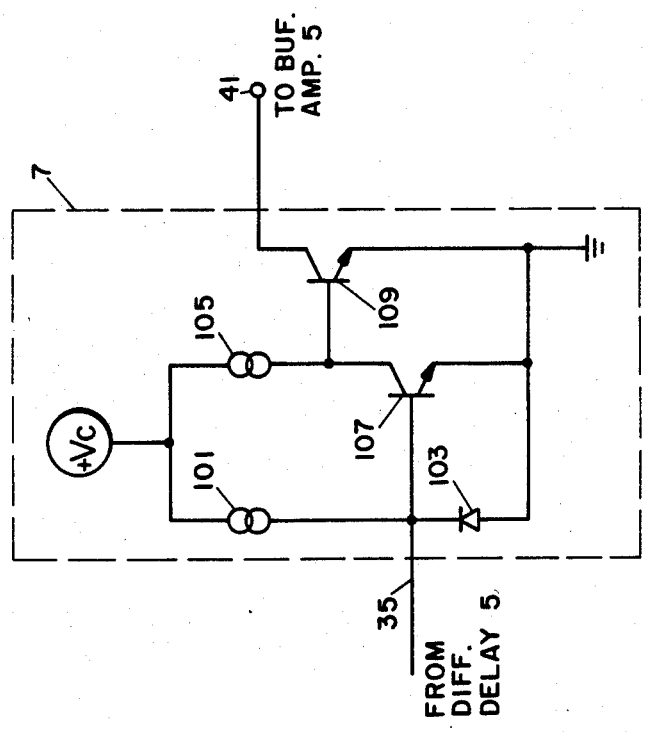
FIG. 6 is a schematic diagram of the switch shown in FIG. 1.

FIG. 6 is a schematic diagram of switch 7, shown in FIG. 1. The state input of switch 7 receives a state control pulse via line 35 from differential delay circuit 5. This pulse is coupled to the base of a transistor 107, and the base of transistor 107 is coupled to the junction of diode 103 and current source 101 which, in turn, are coupled to ground and the +Vc voltage supply, respectively. The emitter of transistor 107 is tied to ground and the collector of transistor 107 is tied, through current source 105 to the +Vc voltage supply.

The collector of transistor 107 is also connected to the base of a transistor 109, the emitter of which is tied to ground. Node 41, also shown in FIG. 1, is taken from the collector of transistor 109. Transistors 107 and 109 may ideally comprise devices fabricated with Schottky base-collector clamp diodes to avoid substrate current due to saturation.

Figure 5:
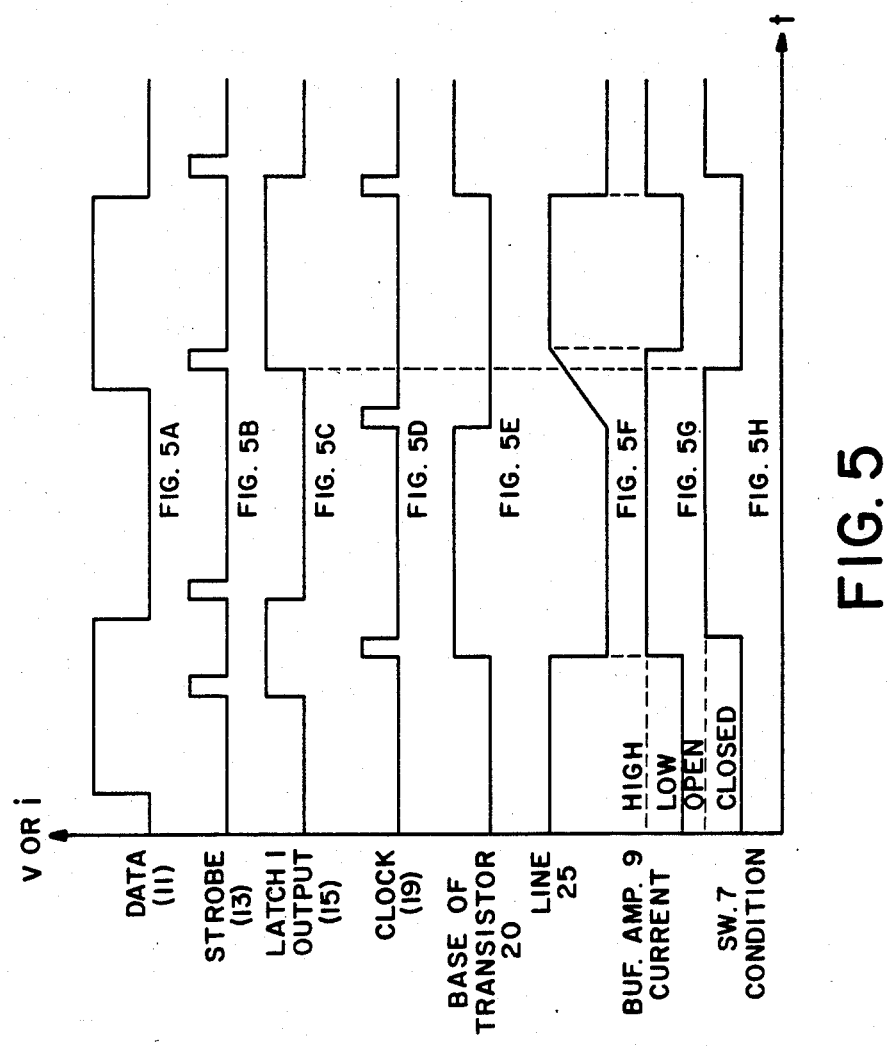
FIGS. 5A-H are timing diagrams of the operation of the circuit depicted in FIG. 1.

The operation of the circuit shown in FIG. 6 may be best understood with additional reference to FIGS. 1, 4 and 5. Switch 7 closes (transistor 109 conducts), effectively grounding node 41, when the data signal on input terminal 11 is low (digital "zero") (FIG. 5A) and a subsequent strobe (FIG. 5B) and clock (FIG. 5D) pulses (digital "ones") are received at input terminals 13 and 19, respectively. It should be noted that such a sequence of signals causes the collector voltage of transistor 20 (FIGS. 4 and 5F) to ramp upwards. When the collector voltage of transistor 20 reaches a predetermined threshold voltage, set by the biasing of transistor 59 and the resultant collector current thereof (differential delay 5), transistor 57 turns on and sinks current from line 35. This, in turn, turns transistor 107 (FIG. 6) off. With transistor 107 off, the base voltage of transistor 109 is allowed to increase and transistor 109 turns on. Since transistor 109 is a low saturation voltage device, when it is turned on, node 41, and the signal thereon, is essentially grounded as desired, interrupting the transmission of that signal to output port 37. Similarly, switch 7 opens when a digital "one" is received at data input terminal 11 and the subsequent strobe and clock pulses are received at input terminals 13 and 19.

Figure 7A:
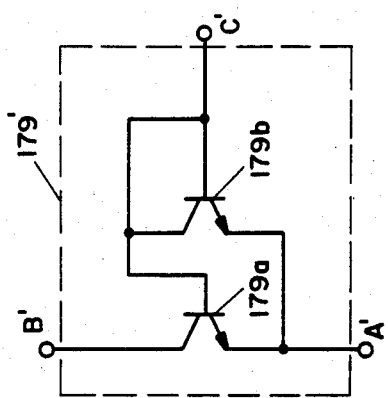
FIG. 7A is a schematic diagram of a pair of interconnected transistors which may be substituted for the double collector transistor 179 of FIG. 7.
Figure 7:
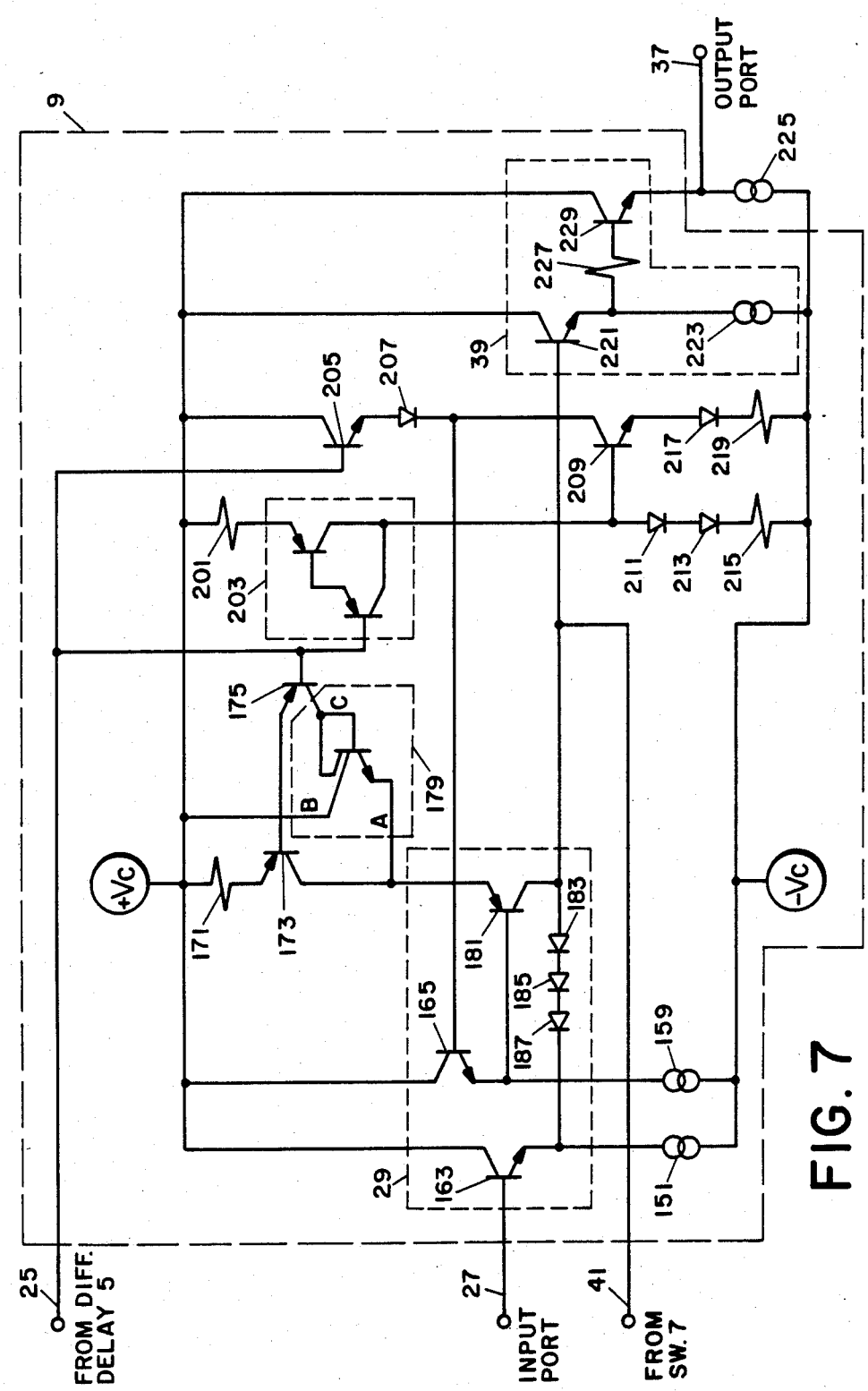
FIG. 7 is a schematic diagram of the buffer amplifier depicted in FIG. 1.

FIG. 7 is a schematic diagram of buffer amplifier 9 shown in FIG. 1. Input port 27 is connected to the base of a transistor 163, the emitter of which is connected through current source 151 to the −Vc voltage supply.

The emitter of transistor 165 is connected to the −Vc voltage supply through current source 159, and its collector is connected to the +Vc voltage supply. The emitter of transistor 165 is also connected to the base of a transistor 181. The collector of transistor 181 is connected through three serially connected diodes 183, 185, and 187 to the emitter of transistor 163. The emitter of transistor 181 is connected through the collector-emitter path of a transistor 173 and a resistor 171 to the +Vc voltage supply. The emitter of transistor 181 is also connected to the +Vc voltage supply via the emitter-collector path of a transistor 179. Transistor 179 has two collectors of equal area with one of said collectors being connected to the +Vc voltage supply. The second collector of transistor 179 is diode connected to the base of transistor 179. The base of transistor 179 is connected to the collector of a transistor 175, the emitter of which is connected to the base of transistor 173.

The base of transistor 175 is connected to the program input line 25 from the differential delay circuit 5. Program input line 25 is also connected to the base of a Darlington pair 203 and to the base of a transistor 205. The emitter of Darlington pair 203 is connected to the +Vc voltage supply through a resistor 201. The collector of transistor 205 is connected to the +Vc voltage supply and the emitter of transistor 205 is connected, through a diode 207, to the collector of transistor 209. The collector of transistor 209 is also connected to the base of transistor 165. The base of transistor 209 is connected to the collector of Darlington pair 203. The emitter of transistor 209 is connected through a serially connected diode 217 and resistor 219 to the −Vc voltage supply. The base of transistor 209 is also connected to the −Vc voltage supply via the serially connected combination of diodes 211 and 213 and resistor 215.

The collector of transistor 221 is connected to the +Vc voltage supply. The base of transistor 221 is connected to the collector of transistor 181 and is also connected to node 41. The emitter of transistor 221 is connected to the −Vc voltage supply through current source 223.

Output port 37 is connected to the emitter of a transistor 229 with the collector of transistor 229 connected to the +Vc voltage supply. The base of transistor 229 is connected to the emitter of transistor 221 through a resistor 227.

The operation of the circuit shown in FIG. 7 may be best understood with additional reference to FIGS. 1, 4, and 6. When it is desired that buffer amplifier 9 conduct a signal from input port 27 to output port 37, transistor 109 (FIG. 6) is turned off (switch 7 opens) and the voltage at node 41 is allowed to float as required. Further, since transistor 57 (FIG. 4) is also turned off, transistor 59 passes all of the collector current of transistor 67. This current together with the collector current of transistor 77 flows out of buffer amplifier 9 into differential delay circuit 5 via line 25 (FIG. 1). That current turns on transistors 175 and 179 (FIG. 7) and the current mirror formed by Darlington pair 203. In turn, current sources 151, 159 and 223 are turned on and buffer amplifier 9 is prepared to transmit a signal between input port 27 and output port 37. The signal is received at input port 27 and is passed via transistors 163, 221 and 229 and diodes 183, 185 and 189 to output port 37.

When it is desired to turn off the switch, node 41 (FIG. 6) is grounded by turning on transistor 109, and the current sources 151, 159 and 223 within buffer amplifier 9 are reduced to an idle condition. Under these conditions, the emitter of transistor 163 is at −0.7 volts which causes diodes 183, 185 and 187 to be non-conductive, the emitter of transistor 221 goes to −0.7 volts, which in turn turns transistor 229 off. This results in the interruption of the transmission of the signal from the input port 27 to output por 37. Further, since transistor 57 (FIG. 4) is turned on in this case, the current flowing into line 25 is decreased. This means that the current flowing out of differential delay circuit 5 on program line 25 (FIG. 7) is also decreased. Note that the amounts of the idle and conducting currents on program line 25 can be set with resistors 79 and 69 (FIG. 4). When the above discussed circuits were tested, an idle current of 800 microamperes was measured for a 7.5:1 decrease in power consumption of the switch in the idle state relative t the conducting state.

It is important to note that the circuit shown in FIG. 7 allows signal path (port 27 to port 37) transition times on the order of 100 nanoseconds with circuit performance being largely independent of variations in the betas of the PNP transistors utilized.

It is important to also note that, although the switch current goes to an idle level when the signal transmission is interrupted, the current sources and transistors of buffer amplifier 9 are never turned off. Thus, no time is lost on turn-on as a result of junction capacitances having to be charged in order to make the transition from a grounded to a conducting state, thus transition times on the order of 100 nanoseconds can be achieved.

Figure 8:
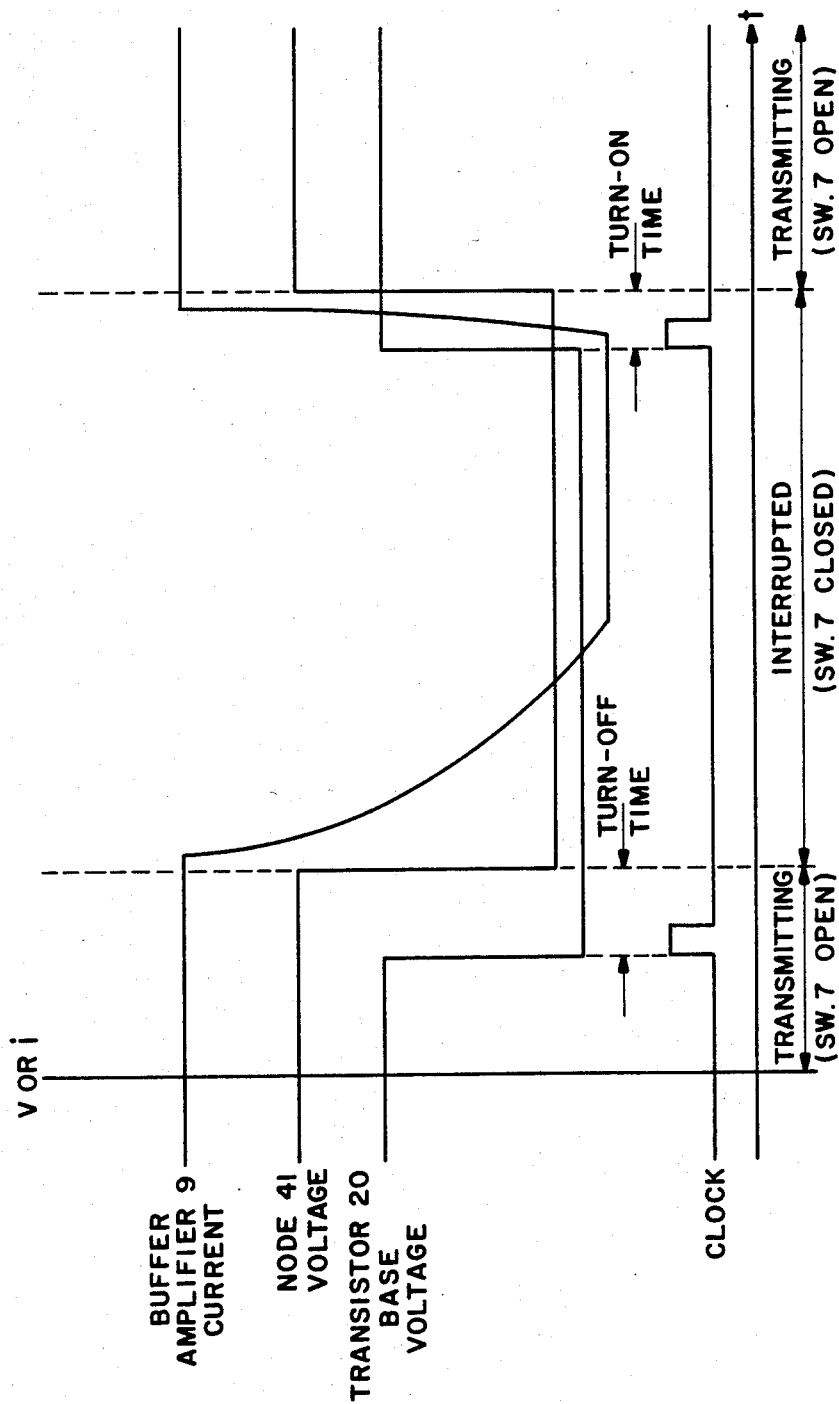
FIG. 8 is a timing diagram of the operation of the buffer amplifier shown in FIG. 7.

The performance of the above-discussed circuit is depicted in the diagrams of FIG. 8. As discussed above, the relative currents of buffer amplifier 9 can be preset with various resistors.

Since a large signal routing system or matrix may include many thousands of crosspoint switches, it is desirable to minimize both the the size and power requirements of such switches. Switches designed as discussed above can be manufactured in a monolithic structure to achieve both of those desired results. In fact, much of the circuit configuration discussed above was derived to optimize the monolithic switch so that it performs as desired. This is particularly true in the buffer amplifier 9 section shown in FIG. 7.

The main problem which must be overcome in any monolithic structure is the problem of not being able to generate lateral PNP devices with a high beta. To overcome this problem, the currents particularly in the buffer amplifier 9 section must be well defined to make the offsets work out correctly so that the entire circuit will be tolerant of the very low beta of the lateral PNP devices in a monolithic structure and yet maintain a fairly high yield of the devices so produced. The attempt here was to produce a circuit which could be turned on and off quickly without instability or oscillation and one that didn't have erratic behavior during the turn-on and turn-off cycles. To achieve that result two current mirrors were included in the circuit for buffer amplifier 9 as shown in FIG. 7. Referring again to FIGS. 4 and 7, note that current programming line 25 between differential delay 5 and buffer amplifier 9 is connected to the +Vc voltage source through diodes 61 and 63 and resistor 65. The impedance of these devices together with resistor 69 selects a voltage level for the programming line 25. Current programming line 25 may also be referred to as the base bias line for Darlington transistor 203 an transistor 175. Darlington transistor 203 is connected as a current mirror which reflects its base current to the current sources 151, 159 and 223 connected to the −Vc voltage supply. Transistors 173 and 175 form a second current mirror which could have been fed directly to the diode string 183, 185, 187 except that this would cause the collector of Darlington transistor 203 to swing at a high frequency which would result in the signal at the anode of diode 183 being distorted because of the collector to base capacitance of transistor 175 and its low cutoff frequency.

To eliminate that problem, the current from the second current mirror, including transistors 173 and 175, is applied to a cascode stage including transistor 181 with the base of transistor 181 tied to the −Vc voltage source through current source 159. In this configuration the base of transistor 181 is connected to a low impedance point, thus blocking the possibility of distortion. However, the low beta of the lateral PNP transistors causes the base current of transistor 181 to degenerate, and thus, making its collector current inaccurate. To overcome this problem it is necessary to introduce a current back into the emitter of transistor 181 to compensate for its own base current loss. To achieve this, NPN transistor 179 is designed to have two collectors of equal area. One of those collectors is diode connected to the base of transistor 179 and the second is connected to the +Vc voltage supply. The diode connected collector of transistor 179 sets up a base emitter voltage which will double the emitter current of that transistor relative to its collector current. Since transistor 179 is looking at the collector current of transistor 175 which is translating the base current of 173, one times the collector current of transistor 175 is approximately one times base current of transistor 173, so the emitter current of transistor 179 is 2 times the base current of transistor 173. That then gets added into the emitter current of transistor 181. This configuration then provides us with an accurate current representation through diodes 183, 185 and 187 of the current on programming line 25 for variations in the betas of the PNP devices in the monolithic structure. In this configuration the lateral PNP devices of the monolithic structure are all in a feed forward configuration so that the transition from the standby current mode to the conduction of buffer amplifier 9 is very rapid. Experimentally this has been observed to take only 100 nanoseconds.

FIG. 7A shows a transistor circuit 179', an alternate implementation of the two collector transistor 179 of FIG. 7. This implementation includes two transistors 179a and 179b which must be matched to achieve the two identical collector currents as discussed above. To achieve the necessary matching of transistors 179a and 179b they must have substantially the same base-emitter junctions and substantially equal collector areas. Transistors 179a and 179b, in order to simulate the operation of the two collector transistor 179, have their bases connected one to the other to form terminal C', their emitters connected one to the other to form terminal A', the collector of transistor 179b connected to the interconnected bases, and the collector of transistor 179a forming terminal B' of transistor circuit 179'. In replacing transistor 179 in FIG. 7 with transistor circuit 179', terminals A', B' and C' would be connected to nodes A, B and C of FIG. 7, respectively.

We claim:

1. A current mirror which is stable and accurate for a broad range of beta gain factors of the individual transistors thereof comprising:

a first and a second transistor both of a first type each having an emitter, a collector and a base terminal, the first and second transistors being connected substantially as a Darlington pair with the free emitter being disposed to be coupled to a potential bus for mirroring the current flowing in the free base terminal thereof; and a third transistor of a second type having an emitter, a base and at least two collector terminals, said third transistor having the base terminal of the third transistor connected to the collector terminal of one of said first and second transistors, the emitter terminal of the third transistor connected to the collector terminal of the other of said first and second transistors, one of the collector terminals of the third transistor connected to the base terminal of the third transistor, and the remaining collector terminal of the third transistor being disposed to be coupled to the potential bus for multiplying the current flowing into the base terminal of the third transistor.

2. A current mirror as in claim 1 wherein said first type of transistors are PNP and said second type of transistors are NPN.

3. A current mirror as in claim 2 wherein the beta value of the first and second transistors may be selected from a broad range of data values with the beta of each of the first and second transistors being close in value.

4. A current mirror as in claim 3 wherein the beta value of the third transistor is several times greater than the beta values of the first and second transistors.

5. A current mirror which is stable and accurate for a broad range of beta gain factors of the individual transistors thereof comprising:

a first and a second transistor both of a first type each having an emitter, a collector and a base terminal, the first and second transistors being connected substantially as a Darlington pair with the free emitter being disposed to be coupled to a potential bus for mirroring the current flowing in the free base terminal thereof; and a third and a fourth transistor each of a second type and each having an emitter, a collector and a base terminal, the base terminals of said third and fourth transistors being interconnected one to the other with the interconnected base terminals connected to the collector terminal of one of said first and second transistors, the emitter terminal of said third and fourth transistors being interconnected one to the other with the interconnected emitter terminals connected to the collector terminal of the other of said first and second transistors, the collector terminal of one of said third and fourth transistors being connected to the interconnected base terminals, and the collector terminal of the other of said third and fourth transistors being disposed to be coupled to the potential bus for multiplying the current flowing into the interconnected base terminals of the third and fourth transistors.

6. A current mirror as in claim 5 wherein said first type of transistors are PNP and said second type of transistors are NPN.

7. A current mirror as in claim 6 wherein the beta value of the first and second transistors may be selected from a broad range of beta values with the beta of each of the first and second transistors being close in value.

8. A current mirror as in claim 7 wherein the base-emitter junctions and the collector areas of the third and fourth transistors are substantially matched, respectively.

9. A current mirror as in claim 8 wherein the beta value of the third and fourth transistors are close in value and several times greater than the beta values of the first and second transistors.

* * * * *